United States Patent
Tanaka et al.

(12) 
(10) Patent No.: US 6,577,005 B1
(45) Date of Patent: Jun. 10, 2003

(54) FINE PROTUBERANCE STRUCTURE AND METHOD OF PRODUCTION THEREOF

(75) Inventors: Shun-ichiro Tanaka, Yokohama (JP); Yutaka Wakayama, Nagoya (JP)

(73) Assignees: Kabushiki Kaishia Toshiba, Kawasaki (JP); Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/555,106
(22) PCT Filed: Nov. 27, 1998
(86) PCT No.: PCT/JP98/05333
§ 371 (c)(1), (2), (4) Date: Jun. 30, 2000
(87) PCT Pub. No.: WO99/28959
PCT Pub. Date: Jun. 10, 1999

(30) Foreign Application Priority Data

Nov. 27, 1997 (JP) .............................. 9-326821

(51) Int. Cl.$^7$ .............................................. H01L 23/48
(52) U.S. Cl. ...................... 257/741; 257/754; 257/771
(58) Field of Search ................................ 257/758, 774, 257/741, 771, 377, 382–384, 754, 768; 438/647, 658, 660

(56) References Cited

U.S. PATENT DOCUMENTS

| | | | |
|---|---|---|---|
| 3,649,882 A | * 3/1972 | Hoffman et al. ............. 317/235 |
| 3,881,971 A | 5/1975 | Greer et al. | |
| 5,308,794 A | 5/1994 | Tu | |
| 5,408,130 A | * 4/1995 | Woo et al. .................... 257/758 |
| 5,604,153 A | 2/1997 | Tsubouchi et al. | |
| 5,644,166 A | * 7/1997 | Honeycutt et al. .......... 257/754 |
| 5,949,097 A | * 9/1999 | Hirata et al. ................. 257/198 |
| 5,962,923 A | * 10/1999 | Xu et al. ...................... 257/774 |
| 5,994,775 A | * 11/1999 | Zhao et al. .................. 257/751 |
| 6,087,194 A | * 7/2000 | Matsukura et al. ........... 438/25 |

FOREIGN PATENT DOCUMENTS

| | | | |
|---|---|---|---|
| JP | 49-115275 | * 11/1974 | |
| JP | 55-91187 | * 7/1980 | ........... H01L/33/00 |

(List continued on next page.)

OTHER PUBLICATIONS

Copy of European Search Report dated Dec. 21, 2000.
Y. Wakayama et al., "Namometer–Scale Si–Au Bilayer Dots Fabricated by Self–Assembly Process Through Liquid Phase Epitaxy", Nanostructured Materials, vol. 8, No. 8, pp. 1033–1039, (1977).
P. Radojkovic et al., "Coulomb Staircase with Negative Differential Resistance at Room Temperature for a Metal Tip–Metal Dot–Semiconductor Double Junction", Surface Science, vol. 361/362, pp. 890–893, (1996).

Primary Examiner—Tom Thomas
Assistant Examiner—Dri Nadav
(74) Attorney, Agent, or Firm—Finnegan, Henderson, Farabow, Garrett & Dunner, L.L.P.

(57) ABSTRACT

A fine particle of metal is disposed on a semiconductor substrate. With the exception of a position of disposition of the fine particle of metal, a covering layer is formed on a surface of the semiconductor substrate. Thereafter, heat treatment is implemented at a temperature higher than that where constituent atoms of the semiconductor substrate and constituent atoms of the fine particle of metal dissolve at an interface thereof due to interdiffusion in a vacuum atmosphere. Thus, a fine projection structure that comprises a semiconductor substrate and a fine projection consisting of a solid solution of the semiconductor substrate and the metal is obtained. The fine projection is formed with part thereof precipitating in the semiconductor substrate. The fine projection structure as this largely contributes in realizing high integration semiconductor devices and quantum size devices.

4 Claims, 2 Drawing Sheets

FOREIGN PATENT DOCUMENTS

| JP | 56-54047 | * | 5/1981 | ........... H01L/21/58 |
| JP | 56-73453 | * | 6/1981 | ........... H01L/21/88 |
| JP | 59-163864 | * | 9/1984 | ............ H02H/2/72 |
| JP | 59-186379 | * | 10/1984 | ........... H01L/33/00 |
| JP | 5-167086 |   | 7/1993 | |
| JP | 7-335584 | * | 12/1995 | ......... H01L/21/223 |
| JP | 9-97835 |   | 4/1997 | |
| JP | 09-102469 | * | 4/1997 | ........... H01L/21/28 |
| JP | 9-252000 |   | 9/1997 | |

* cited by examiner

100nm

FINE PROTUBERANCE STRUCTURE AND METHOD OF PRODUCTION THEREOF

TECHNICAL FIELD

The present invention relates to a fine projection structure having a fine projection consisting of a solid solution of semiconductor-metal of nanometer size and a method for manufacturing the same.

BACKGROUND ART

A degree of integration of semiconductor devices typical in DRAMs is yearly increasing. For instance, the degree of integration of a DRAM has been increased from 16 Mbit to 64 Mbit or 256 Mbit, further being on the increase to Gbit. Such a high integration of semiconductor devices is achieved due to a reduction of a unit device size down to sub-micron order. In developing the finer unit device size, progress in lithography technology has contributed largely. In addition to the progress of lithography technology, an improvement of element structure is also in progress.

As to the lithography technology, exposure technology with KrF excimer laser, which is conformable to 0.25 $\mu$m rule, is developed. With this technology, 64 Mbit-DRAMs are in mass production and 256 Mbit-DRAMs are in progress in a practical application. Further, the exposure technology with the KrF excimer laser is in improvement to conform to 0.15 $\mu$m rule and exposure technology with SOR light or the like is being in progress. However, with the existing lithography technology, approximately 0.1 $\mu$m rule is considered to be a limit. Accordingly, to achieve further higher integration, it is desired to realize in the future a unit device size of nano-meter order.

Further, a device of quantum size, as a candidate for the future LSI technology, is highly expected. For instance, there are quantum-wire and quantum-box devices that make use of wire and box structures respectively of which cross sections are comparable with a quantum mechanical wavelength of an electron, and a resonant-tunneling effect device and resonant tunnel element that make use of a quantum well. Thus, by utilizing a quantum size effect and quantum tunnel effect, new devices are tried to be realized.

In order to positively utilize a quantum effect to develop a new device, it is important for a characteristic dimension of a device not to stay in the order of phase wavelength (0.1 to 1 $\mu$m), that is in a mesoscopic region, but to be reduced to the order of electron wavelength (10 to 100 nm), that is nanoscopic region. Further, to make more effective use of the quantum effect device, the unit device size itself is necessary to be ultra-fine such as, for instance, 10 to 100 nm. However, the existing lithography technology can not realize such a device size with stability.

Further, when considering a practical device structure, after realizing the aforementioned unit device size of nanometer order, bonding state between a conductive layer that is used as various kinds of functional layers and a semiconductor substrate has to be stabilized. When a conductive layer of nanometer order functions as for instance an electrode layer, excellent bonding state between an electrode layer and a semiconductor substrate is necessary to be realized. However, simple disposition of the conductive layer of such a size on the semiconductor substrate can bring about excellent bonding state and more excellent connecting state with a great difficulty.

As mentioned above, study and development of semiconductor devices of ultra-high integration and quantum size devices highly expected as a future candidate of LSI technology are in progress. To realize such ultra-fine devices, the unit device size of nanometer order is necessary to be attained with stability. From these circumstances, ultra-fine technology enabling to attain the unit device size of nanometer is in demand. Further, when considered a practical device structure, bonding and connecting states between the conductive layer and the semiconductor substrate are necessary to be stabilized.

The object of the present invention is to provide a fine projection structure and a manufacturing method thereof. The fine projection structure enables to realize a unit device size demanded in for instance semiconductor devices of ultra-high integration and quantum size devices and to stabilize, in such a device size, bonding and connecting states between a conductive layer and a semiconductor substrate.

DISCLOSURE OF THE INVENTION

A fine projection structure of the present invention comprises a semiconductor substrate, and a fine projection of a maximum diameter of 500 nm or less consisting essentially of a solid solution between a constituent element of the semiconductor substrate and metal and formed selectively at an arbitrary position on a surface of the semiconductor substrate with part thereof precipitating in the semiconductor substrate.

In the present fine projection structure, the fine projection consists of a solid solution between for instance a constituent element of the semiconductor substrate and a metal dissolving the constituent element of the semiconductor substrate at high temperatures. As an applicable semiconductor substrate and metal, a combination of which primary solubility limit at a thermodynamically high temperature region is large and solubility limit at room temperature region decreases largely is used. Accordingly, during heat treatment the solid solution based on the large solubility limit at a high temperature region is formed, and as a fine projection in a final state the solid solution based on the solubility limit of the semiconductor and metal at room temperature region is obtained.

In the present fine projection structure, part of a surface of the semiconductor substrate, with the exception of the fine projection thereon, is covered by a layer. In the present fine projection structure, a maximum diameter of a fine projection can be fine such as 500 nm or less. The size of the fine projection is particularly preferable to be in the range of 20 to 50 nm.

A method for manufacturing a fine projection of a maximum diameter of 500 nm or less structure of the present invention comprises the steps of disposing, on a surface of a semiconductor substrate, a fine particle of a metal; forming a covering layer; and heating in a vacuum atmosphere the semiconductor substrate having the fine particle of metal. The fine particle of metal is capable of dissolving constituent atoms of the semiconductor substrate at high temperatures. The covering layer is formed on the surface of the semiconductor substrate thereon the fine particle of metal is disposed with the exception of the position where the fine particle of metal is disposed. The semiconductor substrate having the fine particle of metal is heated in a vacuum atmosphere to a temperature higher than that where the constituent atoms of the semiconductor substrate and the constituent atoms of the fine particle of metal dissolve due to interdiffusion through an interface thereof to form a fine projection consisting of a solid solution of the constituent atoms of the semiconductor substrate and the constituent atoms of the fine particle of metal.

In the present method for manufacturing a fine projection structure, for the covering layer for instance an oxide film on a surface of a semiconductor substrate can be used. In the present method for manufacturing a fine projection structure, a maximum diameter of the fine particle of metal is preferable to regulate at 1 µm or less, further at 200 nm or less.

In the present invention, for instance the semiconductor substrate covered by a layer with the exception of a position where the fine particle of metal is disposed undergoes heat treatment at a temperature. The temperature is higher than that dissolves mutually the constituent atoms of the semiconductor substrate and the constituent atoms of the fine particle of metal. During the heat treatment, the semiconductor substrate and the fine particle of metal form a solid solution based on interdiffusion through only the interface thereof.

In this case, the primary solubility limit between the semiconductor substrate and the fine particle of metal is large and the semiconductor atoms are prevented from diffusing through other than an interface between the semiconductor/metal. Accordingly, metallic atoms diffuse into the semiconductor substrate side to form a solid solution with part of the fine particle of metal precipitating in the semiconductor substrate. Upon cooling from this state to a room temperature region, an excess of semiconductor atoms is excluded from the solid solution. Thereby, a fine projection consisting of a solid solution between the semiconductor and the metal based on the solubility limit at room temperature region is obtained.

Further, the fine projection consisting of the semiconductor-metal solid solution, a state during heat treatment being nearly maintained, is formed in the form of part thereof precipitating in the semiconductor substrate. The fine projection of the present invention is formed due to self-organizing mechanism, being able to form according to the size and a position of disposition of the initial fine particle of metal.

According to the present fine projection as described above, conforming to the initial size of a fine particle of metal, a unit device size (for instance a single electron device) of nanometer order can be realized. Further, in such a device size, bonding state and connecting state between the fine projection as for instance a conductive layer and a semiconductor substrate can be stabilized.

MODES FOR IMPLEMENTING THE INVENTION

In the following, modes for carrying out the present invention will be explained.

Figure 1A:
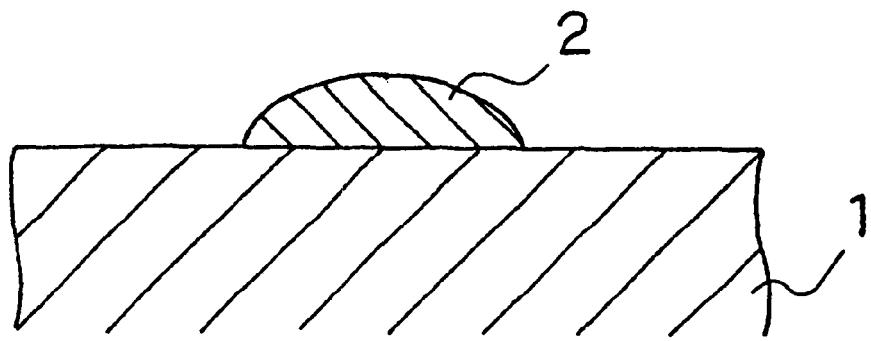
FIGS. 1A, 1B and 1C are diagrams showing schematically one embodiment of steps of manufacturing a fine projection structure of the present invention and the fine projection structure obtained thereby.
Figure 1B:
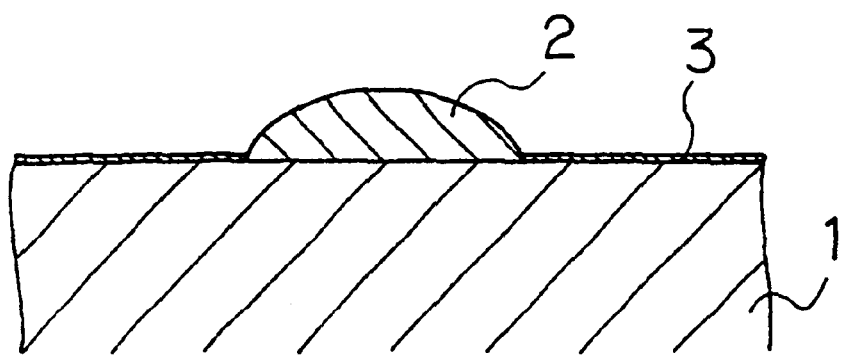
Figure 1C:
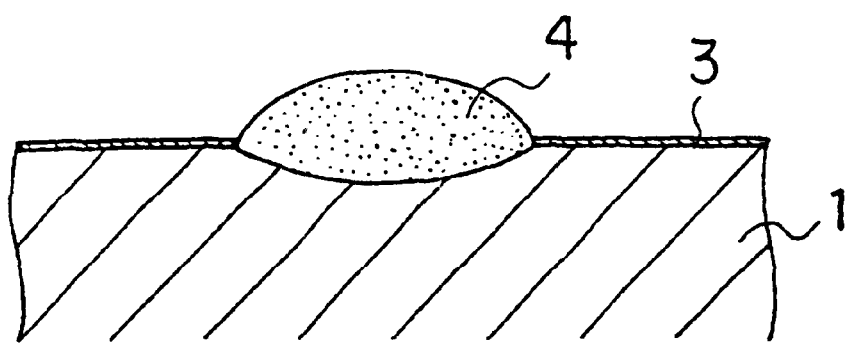

FIGS. 1A to 1C are diagrams showing schematically one embodiment of manufacturing steps of a fine projection structure of the present invention. In manufacturing a fine projection structure of the present invention, first as shown in FIG. 1A, a fine particle of metal 2 is disposed on a semiconductor substrate 1. For the semiconductor substrate, Si substrate, Ge substrate, GaAs substrate or multi-layered substrate thereof can be used.

Here, for the semiconductor substrate 1 and the fine particle of metal 2, a combination showing a thermodynamically endothermic reaction, that is, one of which solubility limit, though large at a high temperature region, largely decreases at room temperature region can be used.

For instance, when Si substrate is used as the semiconductor substrate 1, for constituent material of the fine particle of metal 2, Au, Ag, Cu and Al can be cited. Among these, particularly Au, Ag and Cu large in diffusion coefficient to Si are preferably used. Due to the use of these metals, a fine projection 4 part of which precipitates in the semiconductor substrate 1 and that will be described later in detail can be obtained with ease. Further, when a Ge substrate is used as the semiconductor substrate 1, as constituent material of the fine particle of metal 2, Zn, Cd, Au, Ag and Al can be used.

Further, when an oxide film on the surface of the semiconductor substrate 1 is applied as a covering layer 3 that will be described later, so as to prevent the fine particle of metal 2 from being oxidized during formation of the oxide film on the surface, for the constituent material of the fine particle of metal 2, metals difficult to oxidize such as Au and Ag can be preferably used.

In forming the fine particle of metal 2, a surface of the semiconductor substrate 1 is sufficiently cleaned. On such a surface of the semiconductor substrate 1, for instance under reduced pressure or a vacuum, the fine particle of metal 2 is formed.

Though a method for forming the fine particle of metal 2 is not particularly restricted, a method capable of forming the fine particle of metal 2 on the semiconductor substrate at a room temperature state is applied. When a fine particle of metal 2 is formed on the semiconductor substrate 1 that is heated, a reaction layer or the like is formed at an interface between the semiconductor substrate 1 and the fine particle of metal 2 to be likely to affect adversely on the subsequent steps. As a specific method for forming the fine particle of metal 2, for instance gas-phase condensation method, molecular beam epitaxy method (MBE method) or the like can be cited.

The size of the fine particle of metal 2, as will be described later, needs only to be one of which degree enables the constituent elements of both the semiconductor substrate 1 (for instance Si atoms) and the fine particle of metal 2 to interdiffuse through an interface therebetween to form a solid solution of semiconductor-metal.

In specific, a maximum diameter of the fine particle of metal 2 is preferable to be 1 µm or less, being further preferable to be 200 nm or less. The size of the fine particle of metal 2 is desirable to be made so as to enable to obtain a fine projection 4 of a size of approximately 20 to 50 nm in particular. When the size of the initial fine particle of metal 2 is too large, in the courses of formation and heat treatment thereof, at an interface between the semiconductor substrate 1 and the fine particle of metal 2, a layer of reaction or the like is formed to be liable to affect adversely on the subsequent steps. Further, a dot capable of confining an electron can not be obtained.

Next, as shown in FIG. 1B, on a surface of the semiconductor substrate 1 thereon a fine particle of metal 2 is disposed, with the exception of a position where the fine particle of metal 2 is disposed, a covering layer 3 is formed.

The covering layer 3, in the subsequent heat treatment step, in the courses of raising the temperature up to a heat treatment temperature and maintaining it at the treatment temperature, prevents the constituent atoms of the semiconductor substrate 1 from diffusing on a surface thereof 1. However, when atomic diffusion occurs through the covering layer 3, the covering layer 3 can be disposed on the entire surface of the semiconductor substrate 1. In this case, after forming a semiconductor-metal solid solution, the covering layer 3 functions as an electron barrier layer.

Thus, by suppressing surface diffusion of the semiconductor substrate 1, semiconductor atoms are restricted in supply to the fine particle of metal 2. Thereby, in the step of heat treatment, the constituent atoms of the semiconductor substrate 1 and those of fine particle of metal 2 interdiffuse through only the interface therebetween.

For the covering layer 3, if possible suppressing the surface diffusion of the semiconductor substrate 1, various kinds of materials can be used. For instance, the oxide film on the surface of the semiconductor substrate 1, being easy to form and capable of effectively suppressing the surface diffusion, is preferably used as the covering layer 3.

The oxide film on the surface of the semiconductor substrate 1 as the covering layer 3, after disposing in a vacuum the fine particle of metal 2 on the semiconductor substrate 1, can be easily formed by exposing once the semiconductor substrate 1 to air. The oxide film on the surface as the covering layer 3 needs only to have such a thickness as capable of suppressing the surface diffusion of the semiconductor substrate 1, being enough to have for instance a thickness of approximately 10 nm or less.

Next, the semiconductor substrate 1 thereon the fine particle of metal 2 is disposed undergoes heat treatment in a vacuum atmosphere at a temperature higher than that where the constituent atoms of both the semiconductor substrate 1 and the fine particle of metal 2 interdiffuse to form a solid solution thereof. Thus, by heat treating at a temperature where the constituent atoms of both the semiconductor substrate 1 and the fine particle of metal 2 interdiffuse to form a solid solution, under the heat treatment temperature a semiconductor-metal solid solution can be formed based on the primary solubility limit at the high temperature region.

In this case, since the surface of the semiconductor substrate 1 is covered by the covering 3, the surface diffusion of the semiconductor atoms is restricted. Accordingly, the constituent atoms of both the semiconductor substrate 1 and the fine particle of metal 2 interdiffuse through only the interface thereof.

When the semiconductor-metal solid solution is formed while suppressing the surface diffusion of the semiconductor atoms, in the course of maintaining the high temperature, the metallic atoms diffuse toward the semiconductor substrate 1 to form a solid solution with part of the fine particle of metal 2 precipitating in the semiconductor substrate 1 side. In the course of cooling, though an excess of semiconductor atoms is excluded from the solid solution, while nearly maintaining the shape of the solid solution during the heat treatment, the semiconductor-metal solid solution based on the solubility limit at room temperature region is formed. That is, as shown in FIG. 1C, according to the shape during the heat treatment, a fine projection 4 consisting of the semiconductor-metal solid solution based on the solubility limit at room temperature can be obtained.

Thus, by forming a semiconductor-metal solid solution based on the interdiffusion through only the interface between the semiconductor substrate 1 and the fine particle of metal 2, as shown in FIG. 1C, the fine projection 4 consisting of the semiconductor-metal solid solution based on the solubility limit at room temperature can be formed in the form of part thereof precipitating in the semiconductor substrate 1.

The fine projection 4 consisting of the semiconductor-metal solid solution is formed based on the initial fine particle of metal 2. Accordingly, according to the initial size or the like of the fine particle of metal 2, the maximum diameter of the fine projection 4 can be made 500 nm or less. The size of the fine projection 4 can be made further finer such as 300 nm or less. The size of the fine projection 4 is particularly preferable to be in the range of 20 to 50 nm. According to the present invention, the fine projection 4 of such a small size can be obtained.

After forming the fine projection 4 consisting of the semiconductor metal solid solution, at an interface between the fine projection 4 and the semiconductor substrate 1, an electron barrier can be formed. Such a barrier, by selectively using for instance a material easy in interfacial-diffusion for the covering layer 3 and diffusing such the material due to the interfacial diffusion in the subsequent step after the step of forming the fine projection 4, can be formed.

As mentioned above, by applying the present manufacturing method, at an arbitrary position on the surface of the semiconductor substrate 1, a fine projection 4 consisting of the semiconductor-metal solid solution can be obtained. Since the size of the fine projection 4 can be controlled due to the size of the initial fine particle of metal 2 and the heat treatment temperature, the fine projection 4 can be obtained as a dot of for instance nanometer order. Further, by controlling the position of the disposition of the initial fine particle of metal 2, at an arbitrary position on the semiconductor substrate 1 a fine projection 4 can be formed.

By using such the fine projection 4 as for instance various kinds of conductive layers, further as various kinds of functional layers, for instance single electron devices of nanometer order can be realized separated. That is extremely effective in realizing semiconductor devices of ultra-high integration and quantum size devices. Other than these, various kinds of ultra-fine devices can be realized.

Further, the fine projection 4 consisting of the present semiconductor-metal solid solution is formed in a state of part of the protrusion 4 precipitating in the semiconductor substrate 1. Accordingly, excellent bonding state and connecting state between the fine projection 4 as for instance a conductive layer and the semiconductor substrate 1 can be realized. That brings about an extremely large effect in realizing a practical device structure of such as single electron devices of nanometer order.

Next, specific embodiments of the present invention will be described.

Embodiment 1

First, a Si (111) single crystal substrate (non-doped, $a_0$=0.5431 nm) is prepared. The Si (111) single crystal substrate, after chemical cleaning, to remove surface oxide film and to obtain a hydrogen-terminated Si surface, is dipped in a dilute HF solution (2% by weight) for 30 seconds. Thus pre-treated Si (111) single crystal substrate is mounted in a vacuum chamber with a background pressure of $10^{-6}$ Torr or better.

Next, on a surface of the Si (111) single crystal substrate, a fine particle of Au of a diameter of approximately 200 nm is generated by use of a molecular beam epitaxy method. Then, the Si substrate thereon the fine particle of Au is formed, after once taking out in the air and mounting again in the vacuum chamber, is heat treated under an atmosphere of a high vacuum of 1×10⁻⁸ Torr or better. At this time, the heat treatment temperature is set at 800° C.

Figure 2:
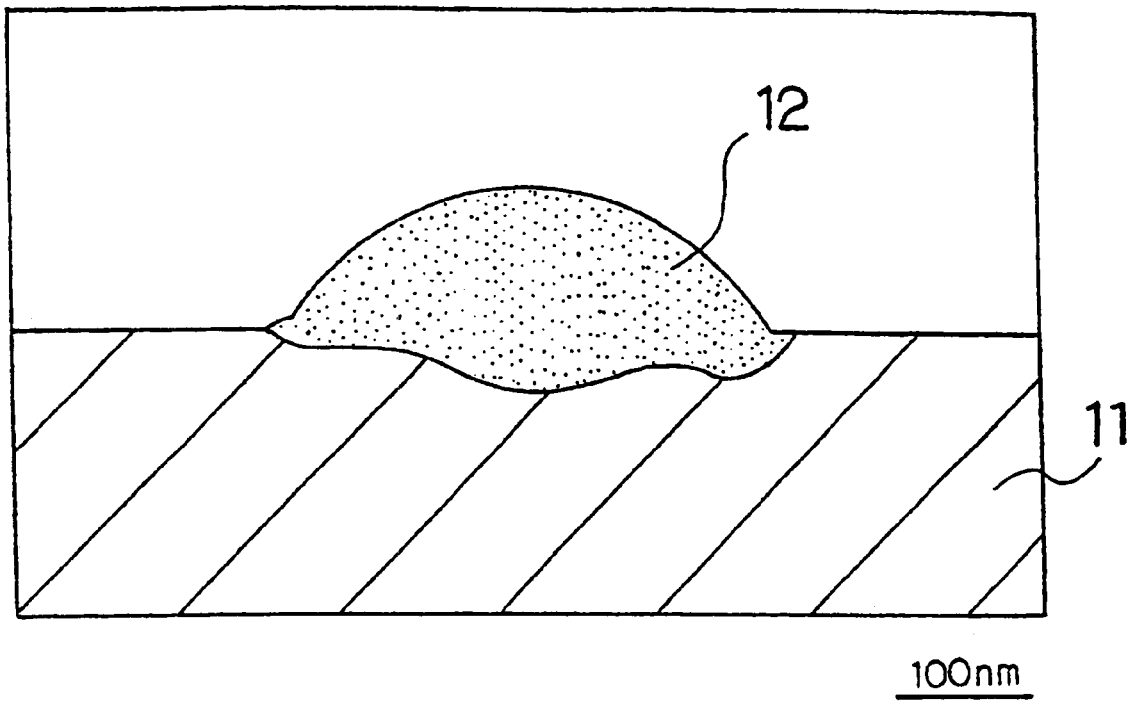
FIG. 2 is a diagram showing schematically a result of TEM observation of a fine projection structure manufactured according to embodiment of the present invention.

The structure and the composition of the aforementioned heat-treated sample are evaluated by the use of a high-resolution transmission electron microscope (HRTEM) and an energy dispersive X-ray spectrometer (EDX). As the result of this, a sectional TEM image of the heat-treated sample is schematically shown in FIG. 2. From the TEM observation of the fine particle of Au formed by the use of the molecular beam epitaxy method, the initial fine particle of Au formed on the Si (111) single crystal substrate is confirmed to have a diameter of approximately 200 nm.

As shown in FIG. 2, a fine projection (fine dot) 12 is confirmed to form on the surface of the heat-treated Si (111) single crystal substrate 11. Further, the fine dot 12 is confirmed to form with the part thereof precipitating in the Si (111) single crystal substrate.

In order to evaluate the composition of the fine dot 12, EDX analysis is carried out. The EDX analysis is implemented with an electron beam of a diameter of beam of 5 nm or less. From the result of the EDX analysis, it is confirmed that from the portion of the Si substrate 11 below the fine dot 12, only Si peaks appear, thus even after the heat treatment, the Si (111) single crystal substrate 11 maintains its state.

On the other hand, from the results of measurements on the portion of the fine dot 12, peaks of Si and Au are detected, thus the fine dot 12 is confirmed to consist of a solid solution between Si and Au. Further, on the surface of the Si (111) single crystal substrate 11 with the exception of the portion where the fine dot 12 is formed, an oxide film is confirmed to form.

Thus, the fine dot 12 consists of a solid solution in which Si dissolves in Au based on the solubility limit thereof, though the shape thereof maintaining that of the initial Au fine particle, part thereof being formed precipitating in the Si (111) single crystal substrate 11. A state of solid solution of Si and Au can be controlled to a homogeneous one or a state having a concentration gradient due to for instance heat treatment.

The aforementioned dot of Si—Au solid solution is supposed to form for instance in the following way.

First, a Si substrate thereon a fine particle of Au is formed is once taken out in the air to oxidize the surface of the Si (111) single crystal substrate with the exception of the position of disposition of the fine particle of Au. The surface of the Si (111) single crystal substrate except the fine particle of Au, after being covered by an oxide film (a covering layer), is heat treated under a high vacuum, thereby Si atoms on the surface of the Si substrate being suppressed in diffusing.

Accordingly, only through an interface between the fine particle of Au and the Si (111) single crystal substrate, Au and Si diffuse mutually, based on the interdiffusion a Si—Au solid solution being formed. By cooling this, an excess of Si atoms are excluded, based on the solubility limit of Si and Au at room temperature, a dot of Si—Au solid solution being formed with the part thereof precipitating in the Si substrate.

The results due to the embodiment show that a dot of Si—Au solid solution of which part bites in the Si substrate, that is, a fine dot of excellent bonding state and connecting state, can be formed in nanometer scale. The size of a dot of Si—Au solid solution, being able to control due to the size of the fine particle of Au, the heat treatment temperature or the like, can be applied to manufacture of various kinds of fine devices.

Embodiment 2

On a surface of the Si (111) single crystal substrate pretreated identical with embodiment 1, an ultra-fine particle of Au of a diameter of approximately 20 nm is deposited. The ultra-fine particle of Au is formed by use of a gas phase condensation method. That is, in an atmosphere of Ar, Au of purity of 99.99% is evaporated to deposit on the Si (111) single crystal substrate as an ultra-fine particle. The ultra-fine particle of Au deposits itself on the Si (111) single crystal substrate under room temperature.

The Si substrate thereon the ultra-fine particle of Au is deposited is once taken out in the air, being mounted again in a vacuum chamber, being heat treated under an atmosphere of a high vacuum of 1×10⁻⁸ Torr or better. The heat treatment is carried out under the identical conditions with those of embodiment 1.

When the state of the heat treated sample is measured and evaluated in the identical way with embodiment 1, as identical as embodiment 1, a fine projection (a dot of Si—Au solid solution) is confirmed to be formed of a solid solution in which Si dissolves in Au based on the solubility limit at room temperature. It is confirmed that the shape of the dot of Si—Au solid solution, though the size thereof is a little bit larger than that of the initial ultra-fine particle of Au, maintains approximately the initial shape thereof, the part of which precipitating in the Si (111) single crystal substrate.

INDUSTRIAL APPLICABILITY

A fine projection structure of the present invention consists of a solid solution of a constituent element of a semiconductor substrate and a metal, showing an excellent bonding state and connecting state to the semiconductor substrate. Such a fine projection structure largely contributes in realizing for instance an ultra-high integration semiconductor device, quantum size device or the like.

What is claimed is:

1. A fine projection structure, comprising:
   a semiconductor substrate including Si and having a flat surface; and
   a fine projection of a maximum diameter of 500 nm consisting essentially of a solid solution between the Si which is a constituent element of the semiconductor substrate and a metal of at least one selected from Au, Ag and Cu, and formed protrusively and selectively at an arbitrary position on the flat surface of the semiconductor substrate, a part of the fine projection penetrating into the semiconductor substrate.

2. The fine projection structure as set forth in claim 1:
   wherein part of a surface of the semiconductor substrate, with the exception of the fine projection thereon, is covered by a covering layer.

3. The fine projection structure as set forth in claim 2:
   wherein the covering layer comprises an oxide film on the surface of the semiconductor substrate.

4. The fine projection structure as set forth in claim 1:
   wherein a maximum diameter of the fine projection is in the range of from 20 to 50 nm.

\* \* \* \* \*

UNITED STATES PATENT AND TRADEMARK OFFICE
CERTIFICATE OF CORRECTION

PATENT NO.     : 6,577,005 B1                                           Page 1 of 1
DATED          : June 10, 2003
INVENTOR(S)    : Tanaka et al.

It is certified that error appears in the above-identified patent and that said Letters Patent is hereby corrected as shown below:

<u>Title page,</u>
Item [73], Assignees, change "Kaishia" to -- Kaisha --.

Signed and Sealed this

Twenty-fifth Day of November, 2003

JAMES E. ROGAN
*Director of the United States Patent and Trademark Office*